United States Patent [19]

Honda

[11] Patent Number: 5,472,830
[45] Date of Patent: Dec. 5, 1995

[54] NON-CORROSION PHOTORESIST STRIPPING COMPOSITION

[75] Inventor: Kenji Honda, Barrington, R.I.

[73] Assignee: OCG Microelectronic Materials, Inc., West Paterson, N.J.

[21] Appl. No.: 228,775

[22] Filed: Apr. 18, 1994

[51] Int. Cl.⁶ .................................................. G03C 5/00
[52] U.S. Cl. .................. 430/331; 430/256; 430/258; 252/156; 252/158; 252/548
[58] Field of Search ................................ 430/331, 256, 430/258; 252/548, 156, 158

[56] References Cited

U.S. PATENT DOCUMENTS

| | | | |
|---|---|---|---|
| 4,306,933 | 12/1981 | Da Fonte, Jr. | 156/644 |
| 4,617,251 | 10/1986 | Sizensky | 430/256 |
| 4,770,713 | 9/1988 | Ward | 134/38 |
| 4,786,578 | 11/1988 | Neisius et al. | 430/256 |
| 4,824,762 | 4/1989 | Kobayashi et al. | 430/258 |
| 4,824,763 | 4/1989 | Lee | 430/258 |
| 4,904,571 | 2/1990 | Miyashita et al. | 430/331 |
| 5,279,771 | 1/1994 | Lee | 252/548 |

FOREIGN PATENT DOCUMENTS

| | | |
|---|---|---|
| 3828513 | 3/1990 | Germany . |
| 56-115368 | 9/1981 | Japan . |
| 63-208043 | 8/1988 | Japan . |
| 1-081950 | 3/1989 | Japan . |
| 4-305660 | 11/1992 | Japan . |

*Primary Examiner*—Mark A. Chapman
*Attorney, Agent, or Firm*—William A. Simons

[57] ABSTRACT

A non-corrosive photoresist stripping composition containing:
(a) 85–10% by weight of an organic polar solvent having a dipole moment of more than 3.5;
(b) 10–40% by weight of selected amine compounds;
(c) 5–30% by weight of selected amino acid having a hydroxyl group; and, optionally,
(d) 0–20% by weight water.

7 Claims, No Drawings

NON-CORROSION PHOTORESIST STRIPPING COMPOSITION

BACKGROUND OF THE INVENTION

1. Field of the Invention

The present invention relates to a non-corrosive photoresist stripping composition containing the combination of (1) selected solvents; (2) selected amines; and (3) selected corrosion-inhibitors.

2. Description of the Prior Art

The photoresist stripper art is replete with numerous references to stripper combinations containing both a polar solvent and an amine compound. The presence of an amine in photoresist stripper compositions has been judged to be essential to effectively remove resist film. However, amine-type photoresist strippers sometimes have a serious problem of corrosion, especially with aluminum substrates.

It is believed that this corrosion proceeds by the ionization of water by the amine in post-stripping water rinses, as residual stripper solution may be retained on the substrate surface and/or substrate carrier after the stripping step. In other words, the amine component of the stripper composition does not corrode the substrate, but may trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent washes. The present invention provides such a solution.

Illustrative of references suggesting photoresist stripper composition containing the combination of a polar solvent and an amine compound are the following:

1. U.S. Pat. No. 4,617,251, which issued to Sizensky et al. on Oct. 14, 1986, teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-prrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide and N-methyl-N-ethyl propionamide) and (B) selected amine compound (e.g., monoethanolamine, monopropanolamine, methylaminoethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or tri-isopropylamine).

5. U.S. Pat. No. 4,824,763, which issued to Lee on Apr. 25, 1989, teaches positive-working photoresist stripping composition containing (A) triamine (e.g., diethylene-triamine) and (B) non-polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. German Published Patent Application No. 3828513, which published on Mar. 1, 1990 and is assigned to Merck patent GMBH, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

8. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

9. Japanese Published Patent Application No. 63-208043, published on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)-ethanol, triethylene(tetramine). The application also teaches a surfactant may be added to the stripper.

10. Japanese Published Patent Application No. 1-081949, which published on Mar. 28, 1989 and is assigned to Asahi Chemical, teaches a positive-working photoresist stripper composition containing (A) gamma-butyrolactone, N-methyl-formamide, N,N-dimethylformamide, N,N-dimethylacetoamide or N-methylpyrrolidone; (B) an amino alcohol (e.g., N-butyl-ethanolamine and N-ethyldiethanolamine); and (C) water.

11. Japanese Published Patent Application No. 4-350660, which is assigned to Texas Instruments, Japan and Kanto Chemical, Inc., teaches a stripper for positive photoresists comprising (A) 1,3-dimethyl-2-imidazolidinone (DMI), (B) dimethylsulfoxide (DMSO) and (C) a water-soluble amine (e.g., monoethanolamine or 2-(2-aminoethoxy)ethanol wherein the amount of the water-soluble amine is 7–30% by weight.

12. U.S. Pat. No. 5,279,791, which issued to Lee on Jan. 18, 1994, teaches a stripping composition for removing resists from substrates containing (A) hydroxylamine (e.g., $NH_2OH$); (B) at least one alkanolamine; and optionally (C) at least one polar solvent.

None of these references suggest the addition of amino acid-type corrosion inhibitors into photoresist strippers.

BRIEF SUMMARY OF THE INVENTION

The present invention, therefore, is directed to a resist stripper composition comprising:

(a) from about 85 to about 10% by weight of an organic polar solvent having a dipole moment of more than 3.5;

(b) from about 10 to about 40% by weight of an amine compound selected from the group consisting of compounds having the formula ( I ):

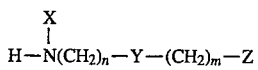

wherein n and m are each independently an integer ranging from 1–5, inclusive; X is hydrogen, alkyl, or alkoxy group; Y is either —O— or —NH—; and Z is hydrogen, —OH, or —$NH_2$;

(c) from about 5 to about 30% by weight of an amino acid selected from the group consisting of compounds having the formula (II):

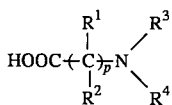

wherein p is an integer ranging from 1–3; $R^1$ and $R^2$ are each independently selected from the group consisting of hydrogen and compounds having the formula (III):

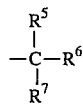

wherein $R^5$, $R^6$, and $R^7$ are each independently selected from hydrogen, —OH, —$CH_2OH$, alkyl, alkoxy phenyl, mono-, di-, or tri-hydroxy-substituted phenyl groups; and $R^3$ and $R^4$ are each independently selected from the group consisting of hydrogen and compounds having the formula (IV):

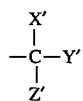

wherein X', Y', and Z' are each independently selected from hydrogen, OH, —$CH_2OH$, —$CH_2CH_2OH$, —$CH_2COOH$, alkyl, or alkoxy group, and at least one of them is —OH or —$CH_2OH$ or —$CH_2CH_2OH$; and (d) from about 0 to about 20% by weight of water, all percentages based on the stripper composition weight.

DESCRIPTION OF THE PREFERRED EMBODIMENTS

As stated above, the anti-corrosive stripper of the present invention has three critical components, namely:

(a) a polar solvent having a dipole moment of at least 3.5;

(b) an amine having hydroxyl group;

(c) a amino acid having hydroxyl group; and, optionally, (d) water as a solution stabilizer.

The solvent used in this stripper composition should have a good solubility for resist film. Therefore, a solvent is necessary to efficiently remove resist film which is strongly adhering to the substrate.

The solvent should meet the following criteria:

(1) Its dipole moment should be more than 3.5.

(2) Its boiling point should be more than 150°–180° C.

(3) Its flash point should be more than 80°–90° C.

Among various candidates, amides are particularly preferred. In particular, cyclic amides such as N-alkyl-2-pyrrolidones (e.g., N-hydroxyethyl-2-pyrrolidone) and 1,3-dialkyl-2-imidazolidinones are especially preferable from a view point of stripping power and toxicity. A suitable solvent mixture may be an admixture of N-hydroxyethyl-pyrrolidone (HEP) and 1,3-dimethyl-2-imidozolidinone (DMI) wherein the mixing ratio of HEP:DMI is from about 95:5% to about 5:95% by weight as HEP is a known safer solvent and DMI is a powerful stripping solvent.

As mentioned above, another major component of the stripper is an amine compound. Alkanolamines are particularly preferable. But an amine cannot efficiently dissolve resist film by itself, probably because of its high viscosity.

Various amines can be used in the stripper composition of this invention. Particularly, amines having at least one hydroxyl group, so-called alkanolamines, are the most preferable; for example, monoethanolamine, 2-(2aminoethoxy)ethanol, 2-(2-aminoethylamino)ethanol, and the like.

The third essential component of the stripper composition of this invention is a selected amino acid compound working as a corrosion inhibitor. Examples of compounds within this class include: tricine, bicine, DL-homoserine, D-homoserine, L-homoserine, DL-threonine, D-allo-threonine, L-allo-threonine, D-threonine, L-threonine, DL-3-hydroxynorvaline, DL-metathroxine, D-4-hydroxohenylglycine, DL-tyrosine, D-tyrosine, L-tyrosine, 3(3,4-dihydroxyphenyl)-DL-alanine, 3-(3,4-dihydroxyphneyl)-L-alanine, 3-(2, 4,5-trihydroxyphenyl)-DL-alanine, DL-alpha-methyltyrosine, L-alphamethytyrosine, (–)-3-(3,4-dihydroxyphenyl)-2-methyl-L-alanine, DL-threo-3-phenylserine, DL-threo-3, 4-dihydroxyphenylserine, and the like. Preferable candidates among them are tricine, bicine, 3-(2,4,5-trihydroxyphenyl)-DL-alanine, and DL-threo-3,4-dihydroxyphenylserine, in terms of cost/performance balance. Examples of compounds outside the formula (II) which may be also useful for this function include: DL-4-amino-3-hydroxybutyric acid, (3's, 4's)-(–)-statine, (+)-muramic acid, 5-hydroxy-DL-lysine, cis-4-hydroxy-D-proline, cis-4-hydroxy-L-proline, trans-4-hydroxy-L-proline, mimosine, N-(4-hydroxyphenyl)glycine, 3,3'5-triiodo-L-thyronine, D-thyroxine, L-thyroxine, D-4-hydroxyphenylglycine, 3-nitro-L-tyrosine, 3-amino-L-tyrosine, 3,5-dinitro-L-tyrosine, chloroacetyl-L-tyrosine, N-acety-l-tyrosinamide, and the like.

It has been found that the presently claimed amino acid compound of formula (II) can effectively inhibit corrosion without any damage of the stripping power of the claimed amines. For example, it is believed that amino acids having hydroxyl groups can form a complex with amines in stripper solutions to reduce basicity of stripper solution. This results in retardation of the corrosion.

In contrast, if an organic or inorganic acid is used instead of the compounds of formula (II), basicity of the amine-containing stripper solution is so much decreased that the stripper power can also be degraded as well. In other words, it is important to choose a moderate acidity of additives as a corrosion inhibitor. In particular, amino acids having hydroxyl group are desirable because the hydroxyl group attached can contribute to enhance a solubility of the resulting complex with amines.

Optionally, water (preferably, deionized water) can be added to the stripper composition of this invention, because some combinations of amines and amino acids tend to form a complex which is least soluble in organic solvents depending on a molar ratio of these two components. In that case, water is helpful to stabilize the stripper solution without precipitation. However, if water is added it may work as a precipitation enhancer to resist components. Therefore, the desirable amount of water in the stripper composition is between zero and 20% by weight based on the total weight of stripper solution. It should be noted that the presence of the amino acid will prevent corrosion occurring, even when water is present in the stripping composition.

The preferred amounts of these four ingredients are about 50–77% polar solvent; about 20–30% amine compound; about 3–10% amino acid corrosion inhibition, and about 0–10% water, all based on the weight of the stripper composition.

Various other ingredients known to those skill in the art may optionally be included in the stripping composition e.g. dyes or colorants, wetting agents, surfactants, antifoamers and so forth. Generally, the amount of each of these optional ingredients would be about 0.5% by weight, based on the total stripper composition The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 15° C. to about 100° C. for a period of about 10 seconds to about 0.5 hours are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripping composition of the invention is effective in removing a wide variety of organic polymeric materials from substrates. Exemplificative organic polymeric materials include positive and negative resists, electron beam resists, x-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethylmethacrylate-containing resists. In particularly preferred embodiments of the invention, the stripping composition has been found to be highly effective in removing positive resists containing a novolak resin and a diazo ketone sensitizer, e.g. ortho naphthoquinone diazide sulfonic acid ester; resists of this type include HPR 204 POSITIVE RESIST, HPR 504 POSITIVE RESIST and HPR 6500 Series POSITIVE RESIST, all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, polyimides, and so forth.

The stripper compositions of present invention can effectively inhibit corrosion without significantly lessening the stripping power of the amine compound. It is believed that amino acids in the present composition form a complex with the amine component to reduce the basicity of the stripper solution and thus retard the corrosion.

The present invention is further described in detail by means of the following Examples and Comparisons. All parts and percentages are by weight and all temperatures are degrees Celsius unless explicitly stated otherwise.

COMPARISONS 1–8 AND EXAMPLES 1–4

A quartz disk (1 inch in diameter) was coated with a photoresist solution, HiPR 6512, commercial product of OCG Microelectronic Materials, Inc., by using a spincoater at 2,500 rpm for 30 seconds at room temperature. Thus coated disk was placed in a convection oven at 100° C. for 30 minutes and then further baked at 180° C. for 30 minutes. The disk dried was then immersed in about 200 ml of a stripper solution, temperature of which was controlled at 95°–100° C. with a hot plate with gentle agitation. The disk was taken out of the solution after a certain period of immersion time, followed by rinsing with water at room temperature.

After the disk was dried with air, transmittance at 280 nm ($T_{280}$) was measured as a function of the immersion time by using a UV-visible spectrometer. The immersion time at which $T_{280}$ reaches 100% was determined as the time-to-clear ($T_c$). Transmittance at 280 nm after 90 seconds of the immersion was also determined as $T^{90}$.

A pH of each stripper solution was measured after diluting a stripper solution (5.0 g) with water (50 g). The corrosion test was also done by dipping aluminum foil into the same solution used for the pH measurement for 3 hours at room temperature, looking at the surface of aluminum foil to see how much darkened the surface became. An extent of the corrosion was observed as done of four categories:

Svr (severe)>Yes (moderate)>Slt (slightly)>No.

Table 1 summarizes the 10 stripper formulations and the results of each test. The following abbreviations represent the components in each formulation:

| AEE | 2-(2-aminoethoxy)ethanol |
| --- | --- |
| NMP | N-methyl-2-pyrrolidone |
| DMI | 1,3-dimethyl-2-imidazolidinone |
| Trc | Tricine |
| HEP | N-hydroethyl-2-pyrrolidone |

The following can be concluded from the results in Table 1:

TABLE 1

A COMPARISON OF VARIOUS STRIPPER COMPOSITIONS

| Example or Comparison | Solvent | Wt. % | Amine | Wt. % | Corsn Inhbtr | Wt. % | Tc (sec) | T⁹⁰ (sec) | pH | Corsn |
|---|---|---|---|---|---|---|---|---|---|---|
| C-1 | NMP | 50 | AEE | 50 | — | — | 90 | 100 | 12.23 | Yes |
| C-2 | — | — | AEE | 100 | — | — | 120 | 95 | 12.37 | Yes |
| C-3 | NMP | 100 | — | — | — | — | ND | 0 | 7.30 | No |
| C-5 | DMI | 100 | — | — | — | — | 600 | 0 | 7.55 | No |
| C-4 | NMP | 70 | AEE | 30 | — | — | 90 | 98 | 12.05 | Svr |
| C-6 | DMI | 50 | AEE | 50 | — | — | — | 87 | 12.18 | Yes |
| C-7 | DMI | 70 | AEE | 30 | — | — | — | 82 | 11.26 | Svr |
| C-8 | HEP | 70 | AEE | 30 | — | — | — | 73 | 11.88 | Svr |
| E-1 | DMI | 70 | AEE | 27 | Trc | 3 | 80 | 96 | 11.24 | Slt |
| E-2 | DMI | 70 | AEE | 20 | Trc | 10 | 95 | 86 | 10.46 | No |
| E-3 | DMI | 70 | AEE | 15 | Trc | 15 | 145 | 74 | 10.02 | No |
| E-4 | HEP | 70 | AEE | 20 | Trc | 10 | 300 | 75 | 10.50 | No |

(1) It can be seen from Comparisons, C1–C3, that the amine component (AEE) is essential in stripping photoresist films and that dilution of the amine with the solvent (NMP) can enhance the stripper power to some extent.

(2) It can be seen from Comparisons, C1 and C4, that there is no strong dependency of the amine concentration on the stripper power.

(3) It can be seen from Comparisons, C3 and C5, that the solvent of DMI is more powerful than NMP for stripping of photoresist films by itself.

(4) It can be seen from Comparison C-8 and Example 4 that the solvent HEP is less powerful than DMI or NMP for stripping of photoresist films.

(5) It can be seen from Comparisons, C5–C7, that AEE is also proved to be essential in combination with DMI and that again the concentration dependency of AEE is not so strong also in this case.

(6) It can be seen from Comparison C7 and Examples, E1–E3, that tricine slows down the rate of the stripping as a function of its concentration, because $T^{90}$ decreases with increasing the concentration of tricine. In other words, the amount of residual film on the substrate increases with increasing the concentration of tricine. On the other hand, the corrosion is more inhibited with increasing the concentration of tricine. Therefore, there should be an optimum concentration of tricine to balance the stripper power and the corrosion inhibition. One of the indicators to determine an optimum concentration of tricine is a pH value of the stripper solution. The corrosion can be inhibited effectively if the pH is below 11. Therefore, it can be said from these results that an optimum concentration of tricine in the stripper composition of DMI and AEE is between 3–10 wt %, where degradation of the stripper power is not so serious.

In summary, addition of tricine to a stripper composition of amine and a polar solvent can inhibit the corrosion of aluminum with a minimum damage of the stripper power so that this ternary composition of stripper solution can be used as a new non-corrosion stripper.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A resist stripper composition comprising:

(a) from about 85 to about 10% by weight of an organic polar solvent having a dipole moment of more than 3.5;

(b) from about 10 to about 40% by weight of an amine compound selected from the group consisting of compounds having the formula (I):

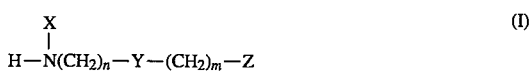

$$H-N(CH_2)_n-Y-(CH_2)_m-Z \quad \text{(I)}$$
with X above the N.

wherein n and m are each independently an integer ranging from 1–5, inclusive; X is hydrogen, alkyl, or alkoxy group; Y is either —O— or —NH—; and Z is hydrogen, —OH, or —NH$_2$;

(c) from about 5 to about 30% by weight of an amino acid selected from the group consisting of compounds having the formula (II):

wherein n is an integer ranging from 1–3; R$^1$ and R$^2$ are each independently selected from the group consisting of hydrogen and compounds having the formula (III):

wherein R$^5$, R$^6$, and R$^7$ are each independently selected from hydrogen, —OH, —CH$_2$OH, alkyl, alkoxy, phenyl, and mono-, di- or tri-hydroxy-substituted phenyl groups; and R$^3$ and R$^4$ are each independently selected from the group consisting of hydrogen and compounds having the formula (IV):

wherein X', Y' and Z' are each independently selected from hydrogen, OH, —CH$_2$OH, —CH$_2$CH$_2$OH, —CH$_2$COOH, alkyl, or alkoxy group, and at least one of them is —OH or —CH$_2$OH or —CH$_2$CH$_2$OH.

(d) from about 0 to about 20% by weight of water all percents based on the weight of the stripper composition.

2. The stripper composition of claim 1 wherein said solvent (a) is a cyclic amide.

3. The stripper composition of claim 2 wherein said cyclic amide is selected from the group consisting of N-alkyl-2-pyrrolidone and 1,3-dialkyl-2-imidazolidinone.

4. The stripper composition of claim 1 wherein said amine (b) is an alkanolamine.

5. The stripper composition of claim 4 wherein said alkanolamine is selected from the group consisting of monoethanolamine, 2-(2-aminoethoxy) ethanol and 2-(2aminoethyl amino) ethanol.

6. The stripper composition of claim 1 wherein said amino acid is selected from the group consisting of: tricine, bicine, DL-homoserine, D-homoserine, L-homoserine, DL-threonine, D-allo-threonine, L-allo-threonine, D-threonine, L-threonine, DL-3-hydroxynorvaline, DL-metathroxine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethytyrosine, (–)-3-(3,4-dihydroxyphenyl)-2-methyl-L-alanine, DL-threo-3phenylserine, and DL-threo-3,4-dihydroxyphenylserine.

7. The stripper composition of claim 6 wherein said amino acid is selected from the group consisting of tricine, bicine, 3-(2,4,5-trihydroxyphenyl)-DL-alanine, and DL-threo-3,4-dihydroxyphenylserine.

* * * * *

UNITED STATES PATENT AND TRADEMARK OFFICE
CERTIFICATE OF CORRECTION

PATENT NO. : 5,472,830
DATED : December 5, 1995
INVENTOR(S) : Kenji Honda

It is certified that error appears in the above-indentified patent and that said Letters Patent is hereby corrected as shown below:

```
In column 8, line 43 (Claim 1); after wherein delete
"n" and insert instead --p--.
```

Signed and Sealed this

Fourteenth Day of May, 1996

Attest:

BRUCE LEHMAN

*Attesting Officer*      *Commissioner of Patents and Trademarks*